United States Patent [19]

Yoshikawa

[11] Patent Number: 5,210,044
[45] Date of Patent: May 11, 1993

[54] METHOD OF MANUFACTURING A FLOATING GATE TYPE NONVOLATILE MEMORY CELL HAVING AN OFFSET REGION

[75] Inventor: Kuniyoshi Yoshikawa, Tokyo, Japan

[73] Assignee: Kabushiki Kaisha Toshiba, Kawasaki, Japan

[21] Appl. No.: 694,674

[22] Filed: May 2, 1991

[30] Foreign Application Priority Data

May 9, 1990 [JP] Japan .................. 2-117456

[51] Int. Cl.⁵ .......................... H01L 21/266
[52] U.S. Cl. ........................... 437/43; 437/30; 437/44; 437/978
[58] Field of Search ............ 437/27, 28, 29, 30, 437/42, 43, 44, 49, 52, 978

[56] References Cited

U.S. PATENT DOCUMENTS

| | | | |
|---|---|---|---|
| 4,622,656 | 11/1986 | Kamiya et al. | 357/23.5 |
| 4,786,609 | 11/1988 | Chen | 437/30 |
| 4,794,565 | 12/1988 | Wu et al. | 357/23.5 |
| 4,814,286 | 3/1989 | Tam | 437/43 |
| 4,852,062 | 7/1989 | Baker et al. | 437/43 |

FOREIGN PATENT DOCUMENTS

| | | | |
|---|---|---|---|
| 0163327 | 7/1987 | Japan | 437/30 |
| 0241379 | 10/1987 | Japan | 437/28 |

Primary Examiner—Brian E. Hearn
Assistant Examiner—C. Chaudhari
Attorney, Agent, or Firm—Banner, Birch, McKie & Beckett

[57] ABSTRACT

A method of manufacturing a floating gate type nonvolatile memory cell having an offset region, wherein the length of the offset region is defined by the portion of the substrate covered by the injection blocking film formed on the side wall of the floating gate electrode. Thus, the offset region is self-aligned with respect to the side wall of the floating gate electrode. Moreover, since the insulating film formed on the floating gate electrode includes a nitride film, it is damaged little while the injection blocking film is being formed on or removed from the side wall of the floating gate electrode. In addition, when an oxide film is formed on the offset region, substantially no additional oxide film is formed on the nitride film in the insulating film on the floating gate electrode, and the thickness of the insulating film does not change.

28 Claims, 4 Drawing Sheets

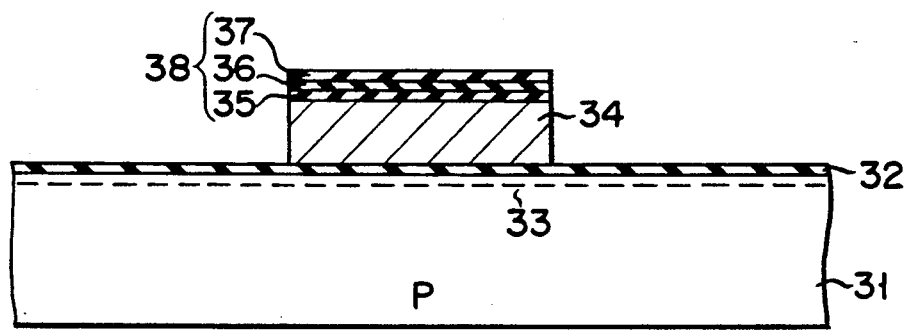
F I G. 4A
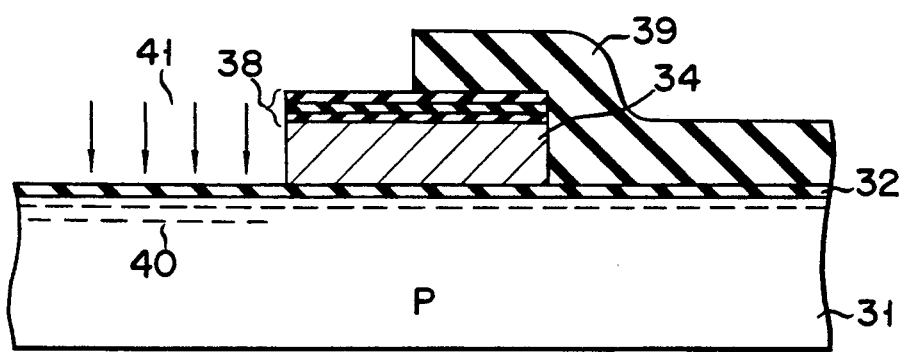
F I G. 4B
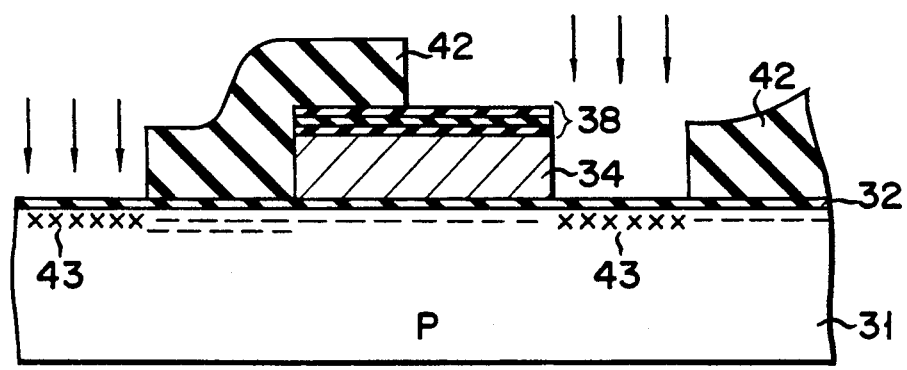
F I G. 4C

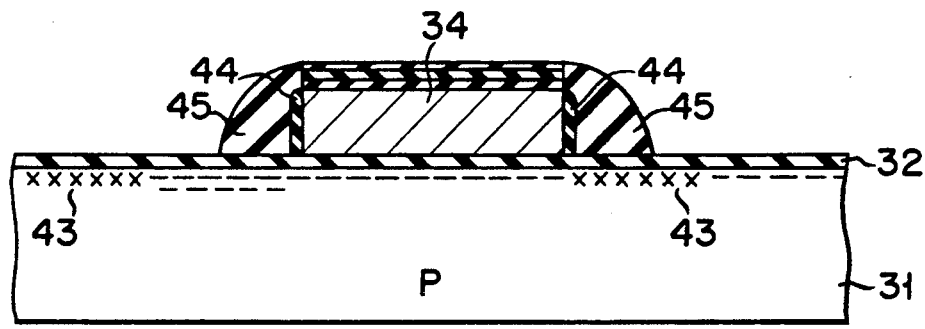
F I G. 4D
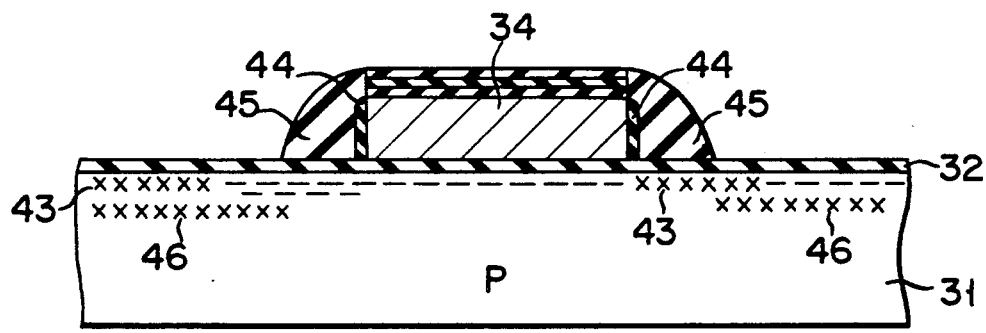
F I G. 4E
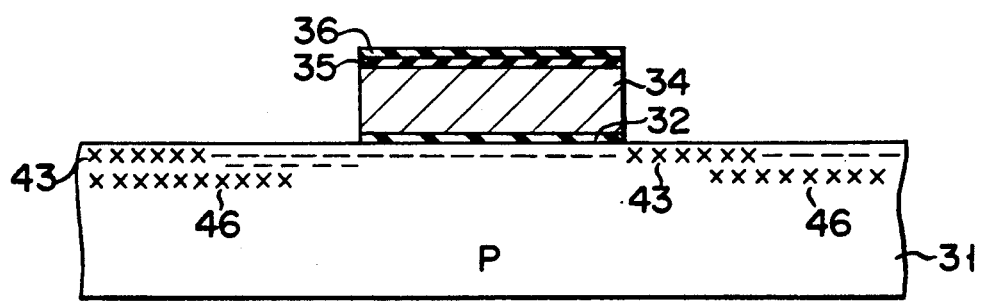
F I G. 4F

METHOD OF MANUFACTURING A FLOATING GATE TYPE NONVOLATILE MEMORY CELL HAVING AN OFFSET REGION

BACKGROUND OF THE INVENTION

1. Field of the Invention

This invention relates generally to a method of manufacturing a nonvolatile semiconductor memory device, and more particularly to a method of manufacturing an erasable programmable nonvolatile semiconductor memory device having two or more gate electrode layers and an offset region.

2. Description of the Related Art

FIG. 1 is a cross-sectional view showing a memory cell portion of a conventional EPROM (erasable programmable read-only memory), for example an EPROM cell having two gate electrode layers and an offset region for increasing a punch-through voltage. An insulating film 12 is formed on a p-type silicon substrate. A floating gate 13 is formed on the insulating film 12. A control gate 15 is formed on an insulating film 14-1 covering the floating gate 13 and an insulating film 14-2 covering the substrate 11. A source region 16 and a drain region 17 are formed in the surface region of the substrate 11 with the floating gate 13 and the control gate 15 provided therebetween. An offset region 18 has a length 19. The above EPROM cell is disclosed in U.S. Pat. No. 4,814,286. The method of manufacturing the EPROM cell will be described below.

The length 19 of the offset region is defined by a photoresist 20 serving as a mask, as shown in FIG. 2. However, this method of defining the length 19 has the following drawbacks: first, it is difficult to form a fine offset region; and second, the length cannot be controlled satisfactorily, since it depends on the mask aligning process.

To overcome these drawbacks, the length of an offset region may be defined by a method as shown in FIG. 3. In this method, ions are injected into the substrate, thereby forming source and drain regions in the same manner as in the method shown in FIG. 2. An insulation film 22 made of, for example, an oxide film is formed by anisotropic etching on the side wall of the floating gate 13. Thereafter, ions are additionally injected into the substrate, using the insulation film 22 as a mask, thereby forming source and drain regions 16 and 17. As a result, a length 23 of an offset region is defined.

In this method, anisotropic etching is performed to form the insulating film 22. During the anisotropic etching, the upper surface of the floating gate 13 is exposed to the etching atmosphere and serves as an etching stopper layer. Hence, the upper surface of the floating gate 13 is damaged and becomes rough, and contaminants are easily deposited on the surface. As a result, the quality of the gate insulating film 14-1, which is formed between the floating gate 13 and the control gate 15, as shown in FIG. 1, is degraded. Accordingly, it is difficult to form a thin gate insulating film.

Moreover, in the above two methods, the gate oxide film, i.e. the insulation film 14-2 is formed on the offset region 18 by a thermal oxidation method. At the same time, the insulation film 14-1 is formed on the floating gate 13. Hence, it is difficult to set the thicknesses of the insulation films 14-1 and 14-2 to desirable values.

As described above, according to the conventional methods, the length of the offset region and the thickness of the gate insulation film are not satisfactorily controlled, and the quality of the gate insulation films is degraded.

SUMMARY OF THE INVENTION

Accordingly, an object of the present invention is to provide a method of manufacturing a nonvolatile memory cell of high reliability, in which the length of an offset region and the thicknesses of gate insulating films are controlled easily and satisfactorily.

The object is achieved by a method of manufacturing a nonvolatile memory cell of a floating gate type having an offset region. According to the present invention, a first gate electrode is formed on an insulating film on a semiconductor substrate of a first conductivity type. A second insulating film, including an oxidation-resistant film and an upper insulating film is formed on the first gate electrode. An injection blocking film for blocking impurity injection is formed on the side wall of the first gate electrode and a portion of the substrate adjacent to the first gate electrode. An impurity of a second conductivity type is injected into the substrate, using the injection blocking film as a mask. The injection blocking film is removed, and a third insulating film is formed on the substrate and the first gate electrode. A second gate electrode is formed on the third insulating film on at least the first gate electrode and a portion of the substrate adjacent to the first gate electrode. An impurity of a second conductivity type is injected into the substrate, using the second gate electrode as a mask.

According to the above method, the length of the offset region is defined by the portion of the surface of the substrate adjacent to the first gate electrode, which is covered by the injection blocking film surrounding the first gate electrode. Thus, the offset region is self-aligned with respect to the wall of the first gate electrode. In addition, since the second insulating film includes an oxidation-resistant film, the gate insulation film is not damaged while the side wall surrounding the first gate electrode is being formed or removed. Moreover, when the forth insulation film is formed on the offset region after the second insulating film is removed, it cannot be easily deposited on the second insulating film including the oxidation-resistant film. Hence, the thickness of the second insulating film remains substantially unchanged. Thus, the fourth insulating film on the offset region and the second insulating film on the first gate electrode are formed so as to have desired thicknesses.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 4A, 4B, 4C, 4D, 4E, 4F and 4G are cross-sectional views of an EPROM cell for explaining in sequence a method according to the present invention.

DETAILED DESCRIPTION OF THE PREFERRED EMBODIMENTS

Figure 1:
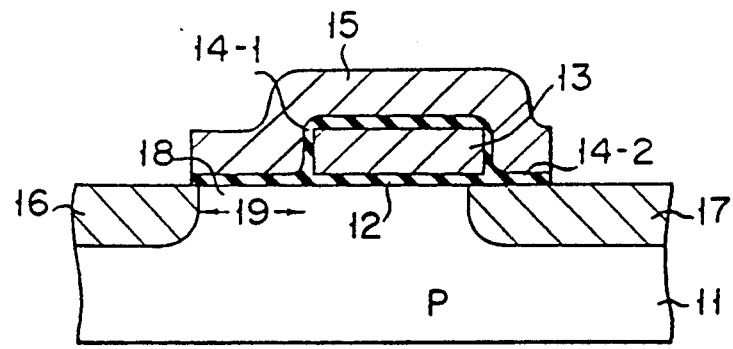
FIG. 1 is a cross-sectional view showing a conventional EPROM cell.
Figure 2:
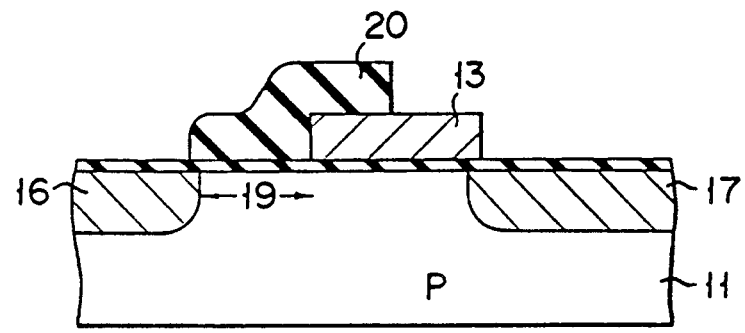
FIG. 2 is a cross-sectional view of an EPROM cell for explaining a step of a method of manufacturing the EPROM cell shown in FIG. 1.
Figure 3:
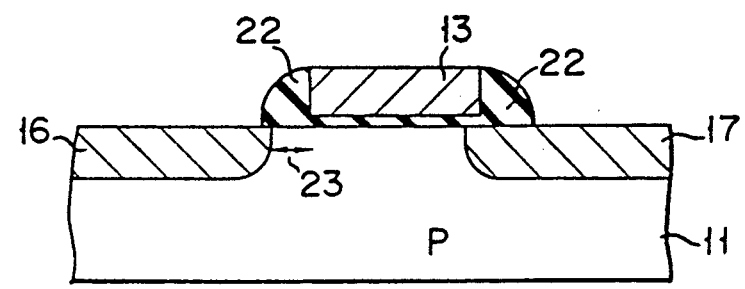
FIG. 3 is a cross-sectional view of an EPROM cell for explaining a step of another method of manufacturing the EPROM cell shown in FIG. 1.

An embodiment of the present invention will now be described with reference to the accompanying drawings.

FIGS. 4A to 4G are cross-sectional views of an EPROM cell for explaining in sequence a method according to an embodiment of the present invention.

First, as is shown in FIG. 4A, an oxide film 32 having a thickness of, for example 20 nm, is formed on a surface of a p-type silicon substrate 31 by a thermal oxidation method. P-type impurity ions for controlling the threshold voltage of the EPROM cell, e.g., boron ions of a dosage of $2 \times 10^{12}$ cm$^{-2}$ are injected into a region 33 of the substrate 31, which includes a channel region of a first gate electrode (to be formed later) serving as a floating gate. Next, a polysilicon layer, approximately 40 nm thick, is formed on the oxide film 32 by a CVD (chemical vapor deposition) method. An oxide film 35, a nitride film 36, and another oxide film 37 are sequentially formed on the polysilicon layer. Then, these films and the polysilicon layers are patterned into a predetermined configuration, thereby forming a first gate electrode 34. In other words, a composite film (insulating film) 38 comprising of the oxide film 35, the nitride film 36, and the oxide film 37 are formed on the first gate electrode 34 made of polysilicon.

Next, a photoresist layer 39 is formed as is shown in FIG. 4B. Impurity ions 41 for controlling the threshold voltage of an offset region are injected into a portion 40 of the substrate including the offset region, using the first gate electrode 34 and the photoresist layer as a mask. The impurity ions 41 may be of either p-type or n-type in accordance with the specification of a device in which the EPROM cell is to be incorporated.

Then, the photoresist layer 39 is removed and an another photoresist layer 42 is formed as is shown in FIG. 4C. N-type impurity ions, e.g., As ions of a dosage of $2 \times 10^{15}$ cm$^{-2}$, are injected into a portion 43, mainly serving as a drain diffusion region.

Next, as is shown in FIG. 4D, after removing the photoresist 42, thermal oxidation is performed to form an oxide film 44 covering the side wall of the first gate electrode 34. Thereafter, a polysilicon layer is deposited on the entire substrate by a CVD method. Then, anisotropic etching is performed to form a polysilicon wall 45 on the side wall of the first gate electrode 34, and covering the portion of the substrate adjacent thereto.

Next, n-type impurity ions, e.g. As ions of a dosage of $5 \times 10^{14}$ cm$^{-2}$ are injected into a portion 46, serving as a part of source and drain regions, as shown in FIG. 4E.

Subsequently, as is shown in FIG. 4F, the polysilicon wall 45 is removed by etching, for example, by a CDE (chemical dry etching) method. During the etching process, although the composite film 38 formed on the first gate electrode 34 is exposed to etching gas, only the uppermost film, i.e., the oxide film 37 is partly etched and no other films below the film 37 are etched. The oxide film 32 excluding the portion just below the gate electrode 34 is removed by the etching.

Figure 4G:
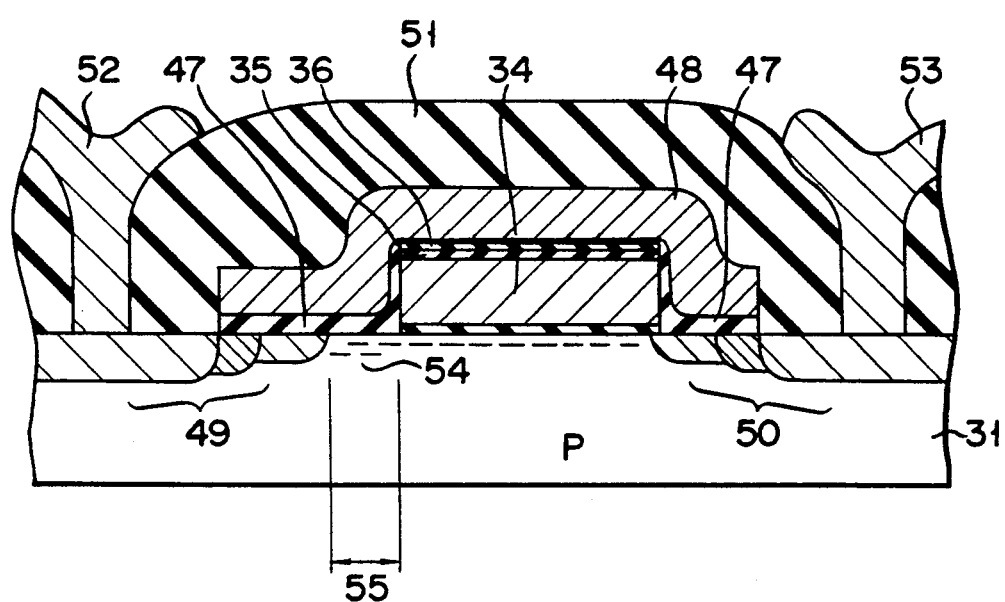

Next, as shown in FIG. 4G, a gate oxide film 47 of a thickness of about 30 nm is formed by a thermal oxidation method on a portion including an offset region 54 of the substrate 31. During the oxidation, an oxide film is formed also on the side wall of the gate electrode 34 and the nitride film 36. However, since the oxidation rate of the nitride film 36 is very low, only an extremely thin oxide film is formed on the nitride film 36, regardless of the period of oxidation time for forming the oxide film 47. Accordingly, the thickness of the accumulation film (the oxide film 35 and the nitride film 36) on the first gate electrode 47 is not substantially changed. Thus, the thicknesses of the oxide film 47 and the accumulation film can be determined independently. Next, a polysilicon layer is formed by a CVD method on the entire substrate to a thickness of about 40 nm so as to cover the first gate electrode 34, and patterned by a photomasking process, thereby forming a second gate electrode 48 serving as a control gate. Using the second gate electrode 48 as a mask, As ions of a dosage of $2 \times 10^{15}$ cm$^{-2}$ are injected into portions of the substrate, thereby forming a source region 49 and a drain region 50. Thereafter, contact holes for exposing portions of the source region 49 and the drain region 50 are opened, and wires 52 and 53 are patterned.

According to the above method, the offset region length 55 (shown in FIG. 4G) substantially corresponds to the length of the portion of the substrate which is covered by the polysilicon wall 45 (shown in FIG. 4E) surrounding the gate electrode 34. Thus, since an offset region is formed in a self-aligning manner with respect to the side wall of the first gate electrode 34, it is possible to form a fine offset region and to satisfactorily control the length thereof.

In general, it is preferable that the thickness of an insulating film on the offset region be as thick as possible to obtain high reliability, since a high electrical field is applied from the second gate electrode (the control gate) to the offset region during a writing operation. Also, it is preferable that the thickness of an insulation film formed between the floating gate and the control gate be as thin as possible, since the larger the capacitance between the control gate and the floating gate, the greater the writing speed and amount. According to the embodiment of the present invention, the thickness of the oxide film 47 formed on the offset region can be set to a desired value, and the thickness of the insulating film between the floating gate (first gate electrode) and the control gate (the second gate electrode) can be set by controlling the thicknesses of the oxide film 35 and the nitride film 36, irrespective of the formation of the oxide film 47. In addition, since the polysilicon wall 45 is removed by a CDE method and a oxide film is formed on the nitride film 36 by reoxidation although very thin, the reliability of the EPROM cell is high.

As described above, the oxide film 37 formed on the first gate electrode serves as an etching stopper during the etching process for removing the polysilicon wall 45, and the nitride film 36 served as an oxidation stopper for protecting the insulating film between the floating gate and the control gate during the oxide film forming process (see FIG. 4F).

Although the above embodiment relates to a method of forming an EPROM cell, the present invention is not limited thereto, but can be applied to a similar structure having two or more gate electrode layers, such as a byte-erasable type EEPROM (electrically EPROM), a EEPROM, a mask ROM, and a DRAM (dynamic random access memory).

As has been described above, according to the method of the present invention, since an offset region is formed in a self-aligned manner, the length thereof can be controlled satisfactorily. In addition, the insulating film 38 formed between the first and second gate electrodes 34 and 48 is not damaged during the manufacturing step. Moreover, since the thicknesses of the insulating film 38 and the insulating film 47, which is formed between the substrate 31 and the second gate electrode 48, can be controlled independently so as to be desired values. As a result, a method of manufacturing a fine nonvolatile memory cell of high reliability is obtained.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a floating gate type nonvolatile memory cell having an offset region, comprising the steps of:
    forming a first insulating film on a substrate of a first conductivity type;
    forming a first gate electrode on said first insulating film;
    forming a second insulating film on said first gate electrode;
    forming an injection blocking film for blocking impurity injection on the side wall of said first gate electrode and a surface portion of said substrate adjacent thereto, a lateral extent of said blocking film defining an offset region;
    injecting an impurity of a second conductivity type into said substrate, using said injection blocking film and said first gate electrode as a mask;
    removing said injection blocking film;
    forming a third insulating film on said substrate and said first gate electrode;
    forming a second gate electrode on said third insulating film on at least said first gate electrode and a portion of said substrate adjacent thereto; and
    injecting an impurity of the second conductivity type into said substrate, using said second gate electrode as a mask.

2. A method of manufacturing a nonvolatile memory cell according to claim 1, wherein said second insulating film is a composite film comprising a silicon oxide film and a silicon nitride film deposited in sequence on said first gate electrode.

3. A method of manufacturing a nonvolatile memory cell according to claim 1, wherein said injection blocking film is formed of a semiconductor which is etched at a speed different from that at which said second insulating film is etched.

4. A method of manufacturing a nonvolatile memory cell according to claim 1, further comprising the step of injecting a plurality of impurities into said substrate using at least an end portion of said first gate electrode as a mask prior to the step of forming an injection blocking film.

5. A method of manufacturing a nonvolatile memory cell according to claim 4, wherein said plurality of impurities includes at lest one impurity of the first conductivity type.

6. A method of manufacturing a floating gate type nonvolatile memory cell having an offset region, comprising the steps of:
    forming a first insulating film on a substrate of a first conductivity type;
    forming a first gate electrode on said first insulating film;
    forming a second insulating film on said first gate electrode;
    forming an injection blocking film, for blocking impurity injection, so as to cover said first gate electrode;
    removing a portion of said injection blocking film by anisotropic etching, such that said injection blocking film remains only on the side wall of said first gate electrode and a portion of said substrate adjacent thereto, a lateral extent of said blocking film defining an offset region;
    injecting an impurity of a second conductivity type into said substrate, using said first gate electrode and the remaining portion of said injection blocking film as a mask;
    removing the remaining portion of said injection blocking film by isotropic etching;
    forming a third insulating film on said substrate and said first gate electrode;
    forming a second gate electrode on said third insulating film on at least said first gate electrode and a portion of said substrate adjacent thereto; and
    injecting an impurity of the second conductivity type into said substrate, using said second gate electrode as a mask.

7. A method of manufacturing a nonvolatile memory cell according to claim 6, wherein said second insulating film is a composite film comprising a silicon oxide film and a silicon nitride film deposited in sequence on said first gate electrode.

8. A method of manufacturing a nonvolatile memory cell according to claim 6, wherein said injection blocking film is formed of a semiconductor which is etched at a speed different from that at which said second insulating film is etched.

9. A method of manufacturing a nonvolatile memory cell according to claim 6, further comprising the step of injecting a plurality of impurities into said substrate using at least an end portion of said first gate electrode as a mask prior to the step of forming an injection blocking film.

10. A method of manufacturing a nonvolatile memory cell according to claim 9, wherein said plurality of impurities includes at least one impurity of the first conductivity type.

11. A method of manufacturing a nonvolatile memory cell according to claim 1, wherein said second insulating film includes an oxidation-resistant film.

12. A method of manufacturing a nonvolatile memory cell according to claim 11 wherein said second insulating film includes an upper insulating film formed on said oxidation-resistant film.

13. A method of manufacturing a nonvolatile memory cell according to claim 12, wherein said first, third and upper insulating films are silicon oxide films.

14. A method of manufacturing a nonvolatile memory cell according to claim 6, wherein said second insulating film includes an oxidation-resistant film.

15. A method of manufacturing a nonvolatile memory cell according to claim 14, wherein said second insulating film includes an upper insulating film formed on said oxidation-resistant film.

16. A method of manufacturing a nonvolatile memory cell according to claim 15, wherein said first, third and upper insulating films are silicon oxide films.

17. A method of manufacturing a nonvolatile memory cell according to claim 1, wherein said injection blocking film includes an oxide film and a polysilicon film.

18. A method of manufacturing a nonvolatile memory cell according to claim 6, wherein said injection blocking film includes an oxide film and a polysilicon film.

19. A method of manufacturing a floating gate type non-volatile memory cell having an offset region, comprising the steps of:
providing a semiconductor substrate;
forming a first insulating film on said semiconductor substrate;
forming a conductive layer on said first insulating film;
forming a second insulating film on said conductive layer;
patterning said second insulating film and said conductive layer to form a first gate electrode having a remaining portion of said second insulating film on an upper surface thereof;
forming a masking layer having a first opening adjacent a first sidewall of said floating gate and a second opening spaced from a second sidewall of said floating gate;
injecting an impurity into said semiconductor substrate through said openings in said masking layer;
removing said masking layer;
forming sidewall films on said first and second sidewalls of said first gate electrode, a lateral extent of said sidewall films defining an offset region;
injecting an impurity into said substrate using said sidewall films and said first gate as a mask;
removing said sidewall films;
forming a third insulating film over a portion of said substrate including said offset region;
forming a polysilicon layer on a resulting structure;
patterning said polysilicon layer to form a second gate electrode; and
injecting ions into said semiconductor substrate using said second gate electrode as a mask.

20. The method according to claim 19, further comprising the step of injecting an impurity into said semiconductor substrate for controlling a threshold voltage of said memory cell before forming said masking layer.

21. The method according to claim 19, wherein the step of forming a second insulating film comprises:
forming a first oxide film on said first conductive layer;
forming a nitride film on said first oxide film; and
forming a second oxide film on said nitride film.

22. The method according to claim 19, wherein the step of forming a blocking film includes the step of forming an oxide film covering the side wall of said first gate electrode and forming a polysilicon layer on said oxide film.

23. The method according to claim 21, wherein said second oxide film is at least partially removed when said blocking film is removed.

24. The method according to claim 19, wherein a gate oxide film is formed on said first gate electrode and a portion of said substrate including said offset region before the step of forming said polysilicon layer.

25. A method of manufacturing a nonvolatile memory cell according to claim 11, wherein said oxidation-resistant film is a silicon nitride film.

26. A method of manufacturing a nonvolatile memory cell according to claim 12, wherein the step of removing said injection blocking film is performed by etching, and said upper insulating film is also at least partially removed in the same step.

27. A method of manufacturing a nonvolatile memory cell according to claim 14, wherein said oxidation-resistant film is a silicon nitride film.

28. A method of manufacturing a nonvolatile memory cell according to claim 15, wherein the step of removing said injection blocking film is performed by etching, and said upper insulating film is also at least partially removed in the same step.

* * * * *